United States Patent
Lee et al.

(10) Patent No.: US 9,048,115 B2
(45) Date of Patent: Jun. 2, 2015

(54) SUPERJUNCTION TRANSISTOR WITH IMPLANTATION BARRIER AT THE BOTTOM OF A TRENCH

(71) Applicant: Vanguard International Semiconductor Corporation, Hsinchu (TW)

(72) Inventors: Tsung-Hsiung Lee, Taoyuan (TW); Shang-Hui Tu, Jhubei (TW); Gene Sheu, Taichung (TW); Neelam Agarwal, Bangalore (IN); Karuna Nidhi, Patna (IN); Chia-Hao Lee, New Taipei (TW); Rudy Octavius Sihombing, Medan (ID)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 13/661,935

(22) Filed: Oct. 26, 2012

(65) Prior Publication Data

US 2014/0117436 A1    May 1, 2014

(51) Int. Cl.
*H01L 29/78* (2006.01)
*H01L 29/08* (2006.01)
*H01L 21/265* (2006.01)
*H01L 29/66* (2006.01)
*H01L 29/06* (2006.01)
H01L 29/417 (2006.01)
H01L 29/10 (2006.01)

(52) U.S. Cl.
CPC ...... *H01L 29/0878* (2013.01); *H01L 21/26586* (2013.01); *H01L 29/41766* (2013.01); *H01L 29/66712* (2013.01); *H01L 29/7802* (2013.01); *H01L 29/0634* (2013.01); *H01L 29/0653* (2013.01); *H01L 29/1095* (2013.01)

(58) Field of Classification Search
CPC ............ H01L 29/7802; H01L 29/7813; H01L 29/66712; H01L 29/66734; H01L 29/4236; H01L 29/7827; H01L 29/66666
USPC .......................................................... 257/329
See application file for complete search history.

(56) References Cited

U.S. PATENT DOCUMENTS

| | | | |
|---|---|---|---|
| 6,307,246 B1 * | 10/2001 | Nitta et al. ..................... | 257/493 |
| 2003/0068863 A1 | 4/2003 | Blanchard et al. | |
| 2005/0023607 A1 * | 2/2005 | Sapp et al. ..................... | 257/329 |
| 2005/0087516 A1 * | 4/2005 | Duerksen et al. ............... | 216/62 |
| 2005/0116312 A1 | 6/2005 | Lim et al. | |
| 2006/0024910 A1 * | 2/2006 | Chatterjee et al. ............ | 438/424 |
| 2007/0281436 A1 * | 12/2007 | Sadaka et al. ................. | 438/400 |
| 2010/0044791 A1 * | 2/2010 | Hebert .......................... | 257/341 |
| 2013/0328105 A1 * | 12/2013 | Matsuura ...................... | 257/139 |

* cited by examiner

*Primary Examiner* — Peter Bradford
(74) *Attorney, Agent, or Firm* — Birch, Stewart, Kolasch & Birch, LLP

(57) ABSTRACT

A method for fabricating a semiconductor device is provided. An epitaxial layer is grown on a substrate, wherein the epitaxial layer and the substrate have a first conductivity type. A trench is formed in the epitaxial layer. A barrier region is formed at a bottom of the trench. A doped region of a second conductivity type is formed in the epitaxial layer and surrounds sidewalls of the trench, wherein the barrier region prevents a dopant used for forming the doped region from reaching the epitaxial layer under the barrier region. The trench is filled with a dielectric material. A pair of polysilicon gates is formed on the epitaxial layer and on both sides of the trench.

15 Claims, 8 Drawing Sheets

SUPERJUNCTION TRANSISTOR WITH IMPLANTATION BARRIER AT THE BOTTOM OF A TRENCH

BACKGROUND

1. Technical Field

The present invention relates to a semiconductor device, and in particular relates to a semiconductor device having a vertical super junction structure with a uniform doping profile and a method for fabricating the same.

2. Description of the Related Art

A conventional VDMOSFET has a p-n junction structure composed of an n-type drift doped region and an overlying p-type doped body region. The p-n junction structure is mainly used to withstand a voltage applied to the conventional VDMOSFET. When improving a withstand voltage of the VDMOSFET, it is required that the dopant concentration be reduced and the thickness of the n-type drift doped region be increased. Improvements in the withstand voltage of the p-n junction structure result in an increased specific on-state resistance (Ron) for the conventional VDMOSFET. The Ron of the conventional VDMOSFET is limited by the dopant concentration of the drift doped region and the thickness of the n-type drift doped region. To resolve this issue, VDMOSFET having a super junction structure has been developed to improve the dopant concentration of the n-type drift doped region, so that the Ron of the VDMOSFET can be improved.

The conventional super junction structure is usually fabricated by multi-epitaxy technology (COOLMOS™). The multi-epitaxy technology requires performing several process cycles of an epitaxy growth process, a p-type dopant implantation process and a thermal diffusion process. Therefore, the multi-epitaxy technology has drawbacks of having plenty of processing steps and a high fabrication cost. In addition, it is hard to reduce the dimensions of the VDMOSFET.

Thus, a semiconductor device and a method for fabricating the same that solve or improve the aforementioned problems are needed.

BRIEF SUMMARY

An exemplary embodiment of a method for fabricating a semiconductor device comprises growing an epitaxial layer on a substrate, wherein the epitaxial layer and the substrate have a first conductivity type. A trench is formed in the epitaxial layer. A barrier region is formed at a bottom of the trench. A doped region of a second conductivity type is formed in the epitaxial layer and surrounds sidewalls of the trench, wherein the barrier region prevents a dopant used for forming the doped region from reaching the epitaxial layer under the barrier region. The trench is filled with a dielectric material. A pair of polysilicon gates is formed on the epitaxial layer and on both sides of the trench, respectively.

An exemplary embodiment of a semiconductor device comprises a substrate of a first conductivity type. An epitaxial layer of the first conductivity type is grown on the substrate, wherein the epitaxial layer comprises at least one trench. A barrier region is formed at a bottom of the trench. A doped region of a second conductivity type is formed in the epitaxial layer and surrounds sidewalls of the trench, wherein the barrier region prevents a dopant used for forming the doped region from reaching the epitaxial layer under the barrier region. A dielectric material is disposed in the trench. A pair of polysilicon gates is disposed on the epitaxial layer and on both sides of the trench, respectively.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

Figure 1:
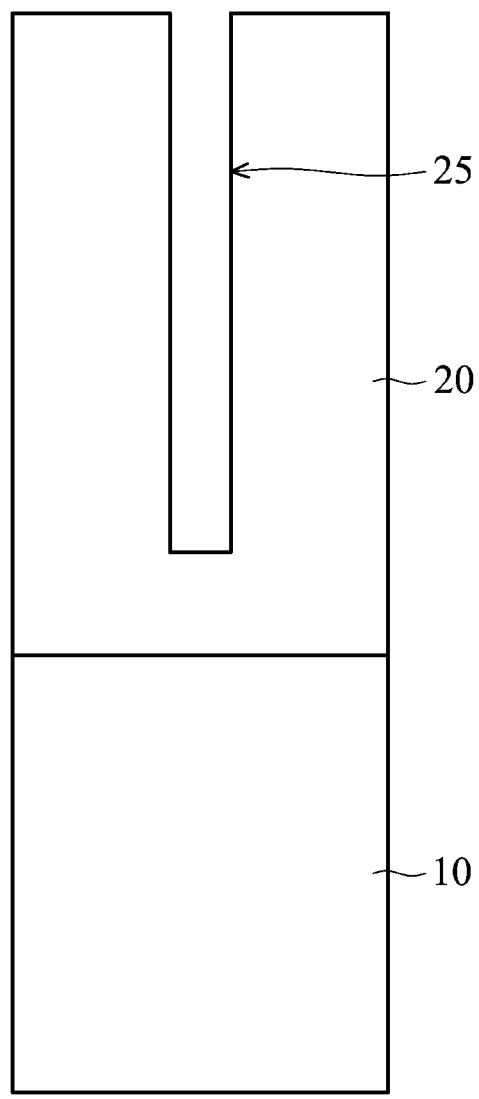
FIGS. 1-4 are cross sections of an exemplary embodiment of a method for fabricating a semiconductor device according to the invention.

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 4:
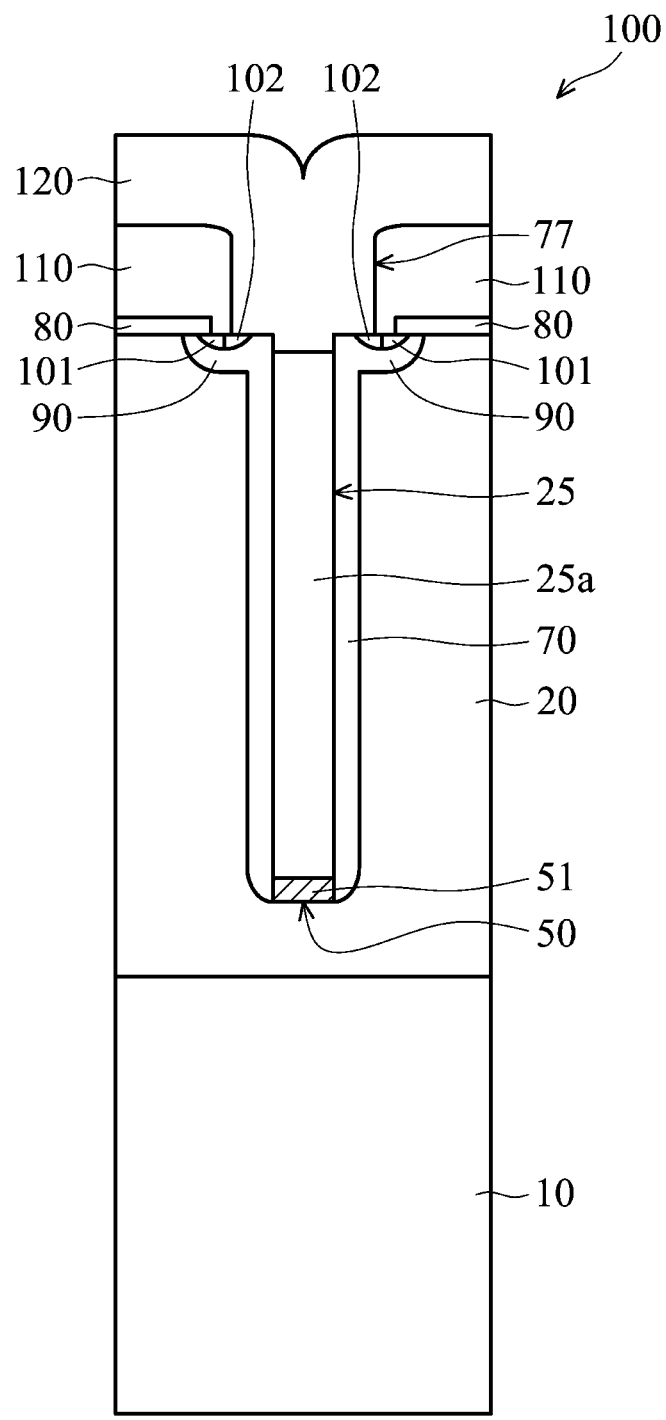

Referring to FIG. 4, a cross section of an exemplary embodiment of a semiconductor device 100 according to the invention is illustrated. The semiconductor device 100 may be implemented as a vertical diffusion metal-oxide-semiconductor field effect transistor (VDMOSFET) having super junction structures. In the embodiment, the semiconductor device 100 comprises a substrate 10 of a first conductivity type (e.g., n-type). The substrate 10 may serve as a drain region and be electrically connected to a drain electrode (not shown). An epitaxial layer 20 of the first conductivity type is grown on the substrate 10. The epitaxial layer 20 comprises one or more trenches therein. For the purpose of brevity and clarity, only one trench 25 is depicted. In the embodiment, the first conductivity type may be p-type or n-type. Moreover, the semiconductor substrate 10 has a doping concentration larger than that of the epitaxial layer 20. For example, when the first conductivity type is n-type, the semiconductor substrate 10 may be a heavily doped n-type (N+) semiconductor substrate 10, while the epitaxial layer 20 may be a lightly doped n-type (N−) epitaxial layer 20.

As shown in FIG. 4, a barrier region 50 is formed at a bottom of the trench 25. In the embodiment, the barrier region 50 comprises an insulating layer 51. The insulating layer 51 may comprise of tetraethyl orthosilicate (TEOS), a nitride, an oxynitride, a photoresist material, or a combination thereof. In one embodiment, the insulating layer 51 may have a multilayered structure comprising an oxide layer, a nitride layer formed on the oxide layer, and a tetraethyl orthosilicate (TEOS) layer formed on the nitride layer.

A doped region 70 of a second conductivity type (e.g., p-type) opposite to the first conductivity type (e.g., n-type) is formed in the epitaxial layer 20 and surrounds the sidewalls of the trench 25. The doped region 70 and the epitaxial layer 20 form a super junction structure for the semiconductor device 100.

A dielectric material 25a is disposed in the trench 25. The dielectric material 25a in the trench 25 may comprise, for example, an oxide, a nitride, undoped polysilicon or combinations thereof.

Referring again to FIG. 4, a pair of polysilicon gates 80 is disposed on the epitaxial layer 20 and on both sides of the trench 25, respectively. The semiconductor device 100 may also comprise additional features that are commonly found in a conventional VDMOSFET such as source and drain regions and wells. For example, the semiconductor device 100 may comprise wells 90 in the epitaxial layer 20 and on both sides of the trench 25.

Further, first source regions 101 may be correspondingly formed in the wells 90, and second source regions 102 may be correspondingly formed in the wells 90, wherein each second source region 102 is adjacent to a corresponding first source region 101 and has a conductivity type opposite to that of the first source region 101.

A second insulating layer 110 may be disposed on the epitaxial layer 20, wherein the pair of polysilicon gates 80 may be embedded in the second insulating layer 110. The second insulating layer 110 may have an opening 77 that exposes a portion of the second source regions 102. A conductive layer 120, which may serve as a source electrode, is disposed on the second insulating layer 110 and fills the opening 77.

FIGS. 1-4 are cross sections of an exemplary embodiment of a method for fabricating the semiconductor device 100 according to the invention. Referring to FIG. 1, a substrate 10 of a first conductivity type (e.g., n-type) is provided. In the embodiment, the substrate 10 may comprise of silicon or other semiconductor materials well known in the art. Moreover, the substrate 10 may serve as a drain region for the fabrication of the semiconductor device.

An epitaxial layer 20 of the first conductivity type is grown on the substrate 10. A hard mask (not shown) may be deposited on the epitaxial layer using a process such as a low pressure chemical vapor deposition (LPCVD) process. Then, the hard mask may be patterned by performing photolithography and etching processes to define one or more trench patterns. Thereafter, a process such as an anisotropic dry etching process may be performed to form one or more trenches in the epitaxial layer 20. For the purpose of brevity and clarity, only one trench 25 is depicted.

Figure 2:
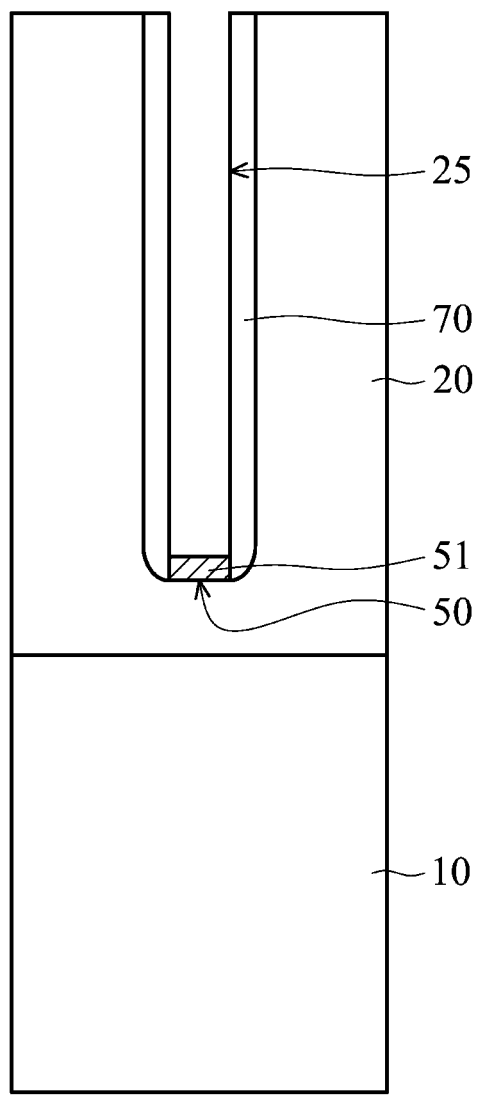

Referring to FIG. 2, a barrier region 50 is formed at a bottom of the trench 25. In the embodiment, the barrier region 50 comprises an insulating layer 51, such as tetraethyl orthosilicate (TEOS), a nitride, an oxynitride, a photoresist material or a combination thereof. Moreover, the insulating layer 51 may be formed by performing a plasma enhanced chemical vapor deposition (PECVD) process or a spin coating process, but it is not limited thereto. For example, the insulating layer 51 may be formed by depositing a TEOS layer having a permittivity of about 4.2 by performing a PECVD process and then densifying the TEOS layer at about 900° C. for about 3 hours. In another embodiment, the insulating layer 51 may have a multilayer structure comprising an oxide layer, a nitride layer formed on the oxide layer, and a TEOS layer formed on the nitride layer. Moreover, thicknesses of the oxide layer, the nitride layer, and the TEOS layer of the insulating layer 51 may be selected to be about 50 angstroms, 200 angstroms, and 2000 angstroms, respectively. However, depending on practical requirements, these layers may be selected to have different thicknesses.

A screen oxide (not shown) may be optionally deposited on the sidewalls of the trench 25 after forming the insulating layer 51. Then, a doped region 70 of a second conductivity type (e.g., p-type) is formed in the epitaxial layer 20 and surrounds the sidewalls of the trench 25. The doped region 70 may be formed by, for example, performing an implantation process on the sidewalls of the trench 25 using a dopant (or an implant species) of the second conductivity type. It is noted that if the second conductivity type is p-type, the dopant may comprise B, $BF_2$, $B_2H_6$, or combinations thereof and provide additional dopants if there are any). Conversely, if the second conductivity type is n-type, the dopant may comprise As, P, or combinations thereof. Parameters of the implantation process for forming the doped region 70, such as dopant type, duration, temperature, energy, and doping angle, may be selected based on practical requirements to optimize the performance of the semiconductor device 100 to be fabricated. In one embodiment, the implantation process may be performed at a medium level energy in a range of 25 keV to 85 keV. In preferred embodiments, the implantation process is performed with a small implantation angle. For example, the angle may be about 2-5 degrees, which corresponds to a grazing angle of about 85-88 degrees.

When the doped region 70 is formed by performing an implantation process, if the trench 25 is too narrow, then an upper portion of the trench 25 may shadow a lower portion of the trench 25 during the implantation process so that the lower portion of the trench 25 remains undoped. Thus, the depth and height (or aspect ratio) of the trench 25 may be appropriately selected with the shadowing effect taken into consideration. For example, the trench 25 may have a depth in a range of 30 to 45 microns and a width such that the trench 25 has an aspect ratio in a range of 1/12 to 1/8. Further, recoil effects may be observed during the implantation process, in which some of the dopant impinging on the sidewalls of the trench 25 are reflected from the sidewalls rather than enter the sidewalls. Consequently, the reflected dopant may end up being deposited at the bottom of the trench 25 to result in a spike in dopant concentration (localized impact ionization), and thus an excess amount of charges of the second conductivity type in the epitaxial layer 20 at the bottom of the trench 25 due to the dopant therein may occur. Thus, the sidewalls of the trench 25 (or the doped region 70) may have a non-uniform doping profile, which may adversely affect the breakdown voltage and hence the electrical performance of the fabricated semiconductor device 100. To resolve the issues related to recoil effects, the insulating layer 51 is formed at the bottom of the trench 25 so that the insulating layer 51 prevents the dopant used for forming the doped region 70 from reaching the epitaxial layer 20 under the barrier region 50 (i.e., insulating layer 51) during the formation of the doped region 70. In particular, the barrier region 50 may block and absorb any dopant that would otherwise reach the epitaxial layer 20 under the bottom of the trench 25 if the barrier region 50 were not present. Thus, by incorporating the barrier region 50 into the semiconductor structure, the resultant doped region 70 (or the sidewalls of the trench 25) may have a substantially uniform doping profile. Depending on practical requirements, the insulating layer 51 may be designed with the appropriate properties (for example, thickness, density, and composition) for the purpose discussed above.

After the implantation process, a diffusion process, such as a rapid thermal annealing (RTA) process may be performed in the doped region 70, thereby activating the dopant therein. The temperature and duration of the diffusion process have to be appropriately selected so that charge balance in the semiconductor device 100 is achieved. Then, the screen oxide (if present) may be removed.

Figure 3:
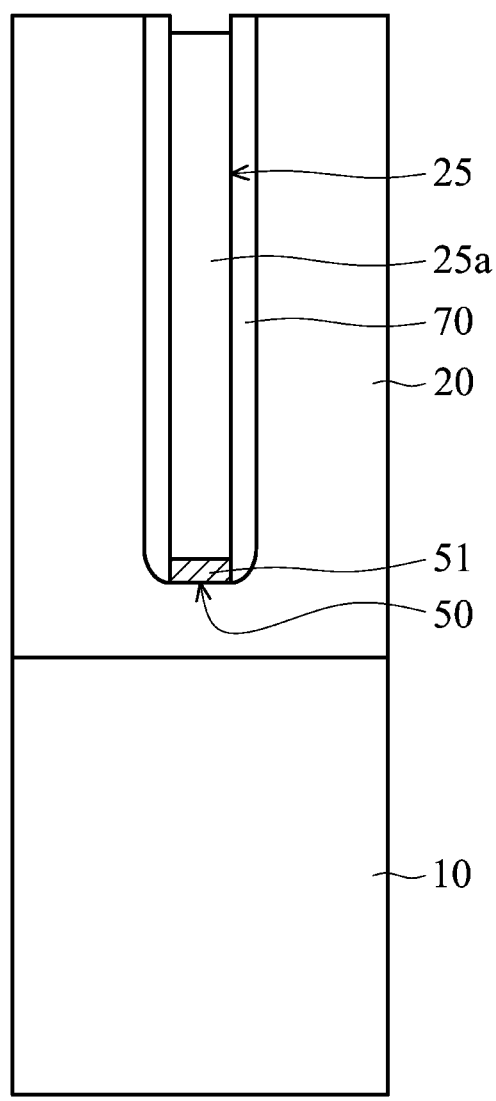

Referring to FIG. 3, the trench 25 is then filled with a dielectric material 25a, such as oxide, nitride, undoped polysilicon or combinations thereof. For example, a process for forming the dielectric material 25a includes, but is not limited to, a high density plasma CVD (HDPCVD) process or a selective area epitaxy (SAE) process. After the trench 25 is filled with the dielectric material 25a, the hard mask (not shown) may be removed by performing a process such as a chemical mechanical polishing (CMP) process thereon.

After the step shown in FIG. 3, an additional process may be performed to complete the fabrication of the semiconductor device 100, which is shown in FIG. 4. For example, the additional process may comprise a MOS process commonly performed for fabricating a VDMOSFET. After performing the MOS process, a pair of polysilicon gates 80 is formed on the epitaxial layer 20 and on both sides of the trench 25. Well 90 is formed in the epitaxial layer 20 and on both sides of the trench 25. Further, first source regions 101 are correspondingly formed in the well 90 on both sides of the trench 25, and second source regions 102 are correspondingly formed in the well 90 on both sides of the trench 25, wherein each second source region 102 is adjacent to a corresponding first source region 101. A second insulating layer 110 is grown on the epitaxial layer 20, so that the pair of polysilicon gates 80 is embedded therein. The second insulating layer 110 may have an opening 77 that exposes a portion of the second source regions 102. A conductive layer 120, which may serve as a source electrode, is formed on the second insulating layer 110 and fully fills the opening 77.

Figure 8:
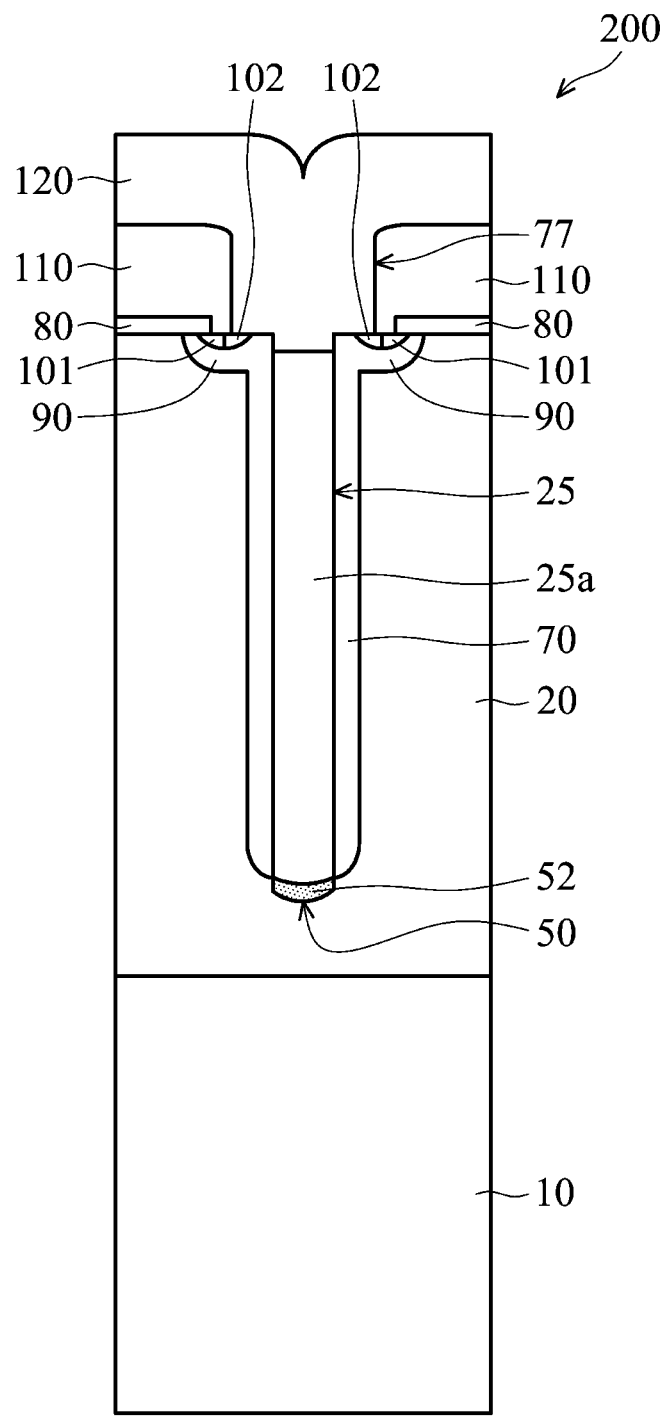

Referring to FIG. 8, a cross section of another exemplary embodiment of a semiconductor device 200 according to the invention is illustrated. Elements in FIG. 8 that are the same as those in FIG. 4 are labeled with the same reference numbers as in FIG. 4 and are not described again for brevity. In general, the semiconductor device 200 is similar to the semiconductor device 100 except that for the semiconductor device 200, the barrier region 50 is replaced by another doped region 52 formed in the epitaxial layer 20 at the bottom of the trench 25. In the embodiment, the doped region 52 is of the first conductivity type.

Figure 5:
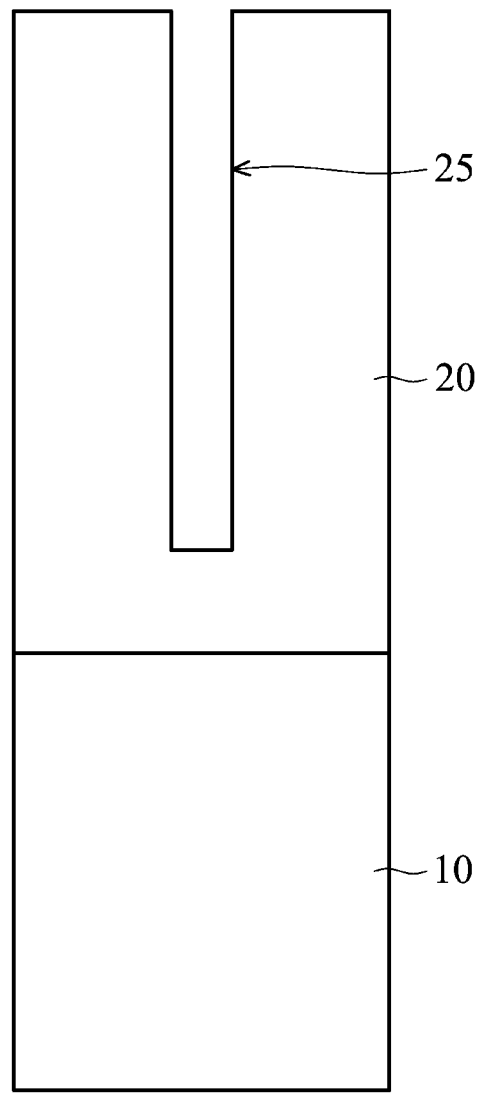
FIGS. 5-8 are cross sections of another exemplary embodiment of a method for fabricating a semiconductor device according to the invention.

FIGS. 5-8 are cross sections of an exemplary embodiment of a method for fabricating the semiconductor device 200 according to the invention. Elements in FIGS. 5-8 that are the same as those in FIGS. 1-4 are labeled with the same reference numbers as in FIGS. 1-4 and are not described again for brevity. In general, the method for fabricating the semiconductor device 200 is similar to that for the semiconductor device 100 except that for the semiconductor device 200, the barrier region 50 (i.e., another doped region 52) is formed in the epitaxial layer 20 at the bottom of the trench 25. Referring to FIG. 5, similarly, an epitaxial layer 20 formed on a substrate 10 is provided, wherein the epitaxial layer 20 and the substrate 10 are of the first conductivity type. One or more trenches 25 are similarly formed in the epitaxial layer 25. For the purpose of brevity and clarity, only one trench 25 is depicted.

Figure 6:
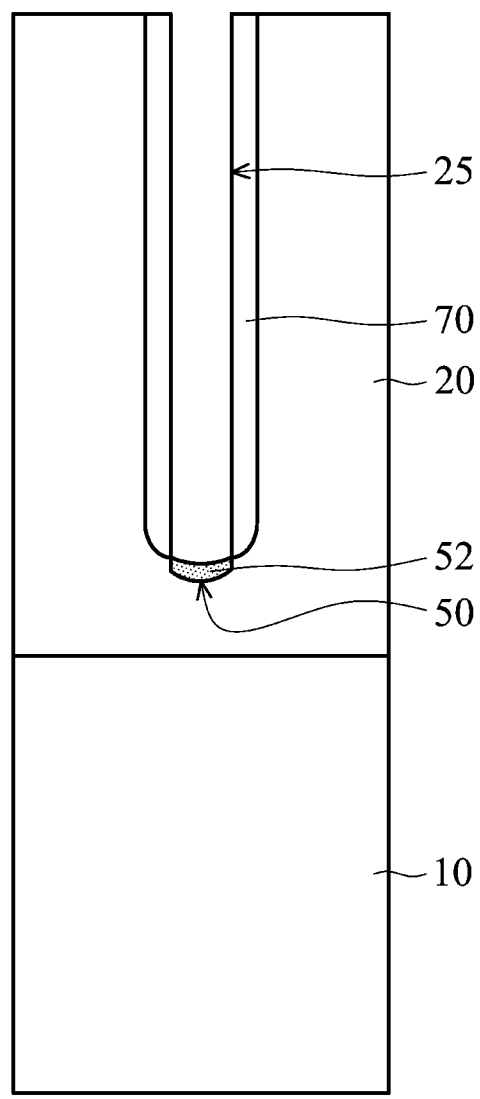

Referring to FIG. 6, a barrier region 50 is formed in the epitaxial layer 20 at the bottom of the trench 25, and a doped region 70 of the second conductivity type is formed in the epitaxial layer 20 and surrounds the sidewalls of the trench 25. In the embodiment, the barrier region 50 comprises another doped region 52 of the first conductivity type.

The doped region 52 may be formed by an implantation process. Parameters of the implantation process for forming the doped region 52, such as dopant type, duration, temperature, energy, and doping angle, are selected based on practical requirements to optimize the performance of the semiconductor device 200 to be fabricated. Preferably, the implantation process may be performed with a zero or close-to-zero angle, so that the another doped region 52 may be formed substantially only at the bottom of the trench 25 in the epitaxial layer 20. If the first conductivity type is p-type, the doped region 52 comprises a dopant including B, $BF_2$, $B_2H_6$, or combinations thereof and provides additional dopants if there are any). If the first conductivity type is n-type, the dopant may include As, P, or combinations thereof. The dopant used in forming the doped region 52 may be the same as the dopant comprised in the epitaxial layer 20.

The doped region 70 may be formed by performing an implantation process on the sidewalls of the trench 25 using a dopant of the second conductivity type. Similarly, parameters of the implantation process for forming the doped region 70, such as dopant type, duration, temperature, energy, and doping angle, are selected based on practical requirements for optimizing the performance of the semiconductor device 200 to be fabricated. In one embodiment, the implantation process may be performed at a medium level energy in a range of 25 keV to 85 keV.

In one embodiment, the doped region 52 is formed after forming the doped region 70. In this embodiment, when a first implantation process using an implant species of the second conductivity type is performed to form the doped region 70, recoil effects may be observed as discussed previously. Consequently, there may be a spike in the dopant concentration and thus an excess amount of charges of the second conductivity type in the epitaxial layer 20 at the bottom of the trench 25 due to the dopant therein may occur. Accordingly, the sidewalls and bottom of the trench 25 may have a non-uniform doping profile. However, by forming the doped region 52 of the first conductivity type (which is formed by performing an implantation process using an implant species of the first conductivity type) in the epitaxial layer 20 at the bottom of the trench 25, charges of the second conductivity type in this region may be adjusted. In one embodiment, the charges in the epitaxial layer 20 at the bottom of the trench 25 may be adjusted to be converted to the first conductivity type, so that the sidewalls of the trench 25 may have a substantially uniform doping profile. As such, negative impacts of recoil effects on the properties or performance of the fabricated semiconductor device 200 may be reduced or eliminated.

In another embodiment, the doped region 52 is formed before forming the doped region 70, i.e., when forming the doped region 70, the doped region 52 is already formed by, for example, performing an implantation process using an implant species of the first conductivity type. In this embodiment, the doped region 52 may act as a buffer layer to adjust the charges carried by the dopant (or implant species) implanted into the region. Similarly, the charges in the epitaxial layer 20 at the bottom of the trench 25 may be adjusted to become electrically neutral, or be converted to the first conductivity type. In this embodiment, the sidewalls of the trench 25 may have a substantially uniform doping profile. As such, negative impact of recoil effects on the properties or performance of the fabricated semiconductor device 200 may be reduced or eliminated.

Figure 7:
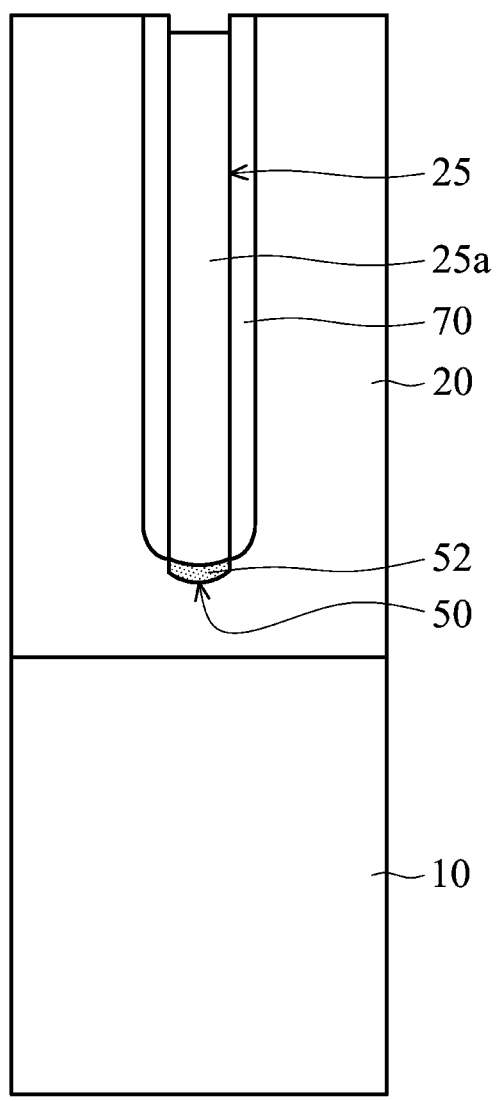

Referring to FIG. 7, the trench 25 is then filled with a dielectric material 25a, as described in FIG. 3. After the step shown in FIG. 7, an additional process may be performed to complete the fabrication of the semiconductor device 200, which is shown in FIG. 8. For example, the additional process may comprise a MOS process commonly performed for fabricating a VDMOSFET. After performing the MOS process, a pair of polysilicon gates 80 is formed on the epitaxial layer 20 and on both sides of the trench 25. Wells 90 are formed in the epitaxial layer 20 and on both sides of the trench 25. Further, first source regions 101 are correspondingly formed in the wells 90, and second source regions 102 are correspondingly formed in the wells 90, wherein each second source region 102 is adjacent to a corresponding first source region 101. A second insulating layer 110 is formed on the epitaxial layer 20, so that the pair of polysilicon gates 80 is embedded therein. The second insulating layer 110 may have an opening 77 that exposes a portion of the second source regions 102. A conductive layer 120, which may serve as a source electrode, is formed on the second insulating layer 110 and fully fills the opening 77.

The method of fabricating the semiconductor devices according to the embodiments described above solves issues related to ion recoil effects. Accordingly, the fabricated semiconductor devices have substantially uniform doping profiles that break the Si limit in terms of specific on-state resistance. For example, the semiconductor devices according to the embodiments above have a low specific on-resistance (<25 mΩ·cm$^2$) while maintaining a high breakdown voltage (>700 V).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
    growing an epitaxial layer on a substrate, wherein the epitaxial layer and the substrate have a first conductivity type;
    forming a trench in the epitaxial layer;
    forming a barrier region at a bottom of the trench, wherein the trench has an aspect ratio in a range of 1/12 to 1/8;
    forming a doped region of a second conductivity type in the epitaxial layer and surrounding sidewalls of the trench by an angled implantation process, wherein an implantation angle of the implantation process is about 2-5 degrees, such that the doped region surrounds a sidewall of the barrier region from a top to a bottom of the sidewall of the barrier region, wherein the barrier region prevents a dopant used for forming the doped region from reaching the epitaxial layer under the barrier region;
    filling the trench with a dielectric material; and
    forming a pair of polysilicon gates on the epitaxial layer and on both sides of the trench.

2. The method of claim 1, wherein the barrier region comprises an insulating layer.

3. The method of claim 2, wherein the insulating layer comprises a photoresist material.

4. The method of claim 2, wherein the insulating layer is a multilayered structure comprising an oxide layer, a nitride layer formed on the oxide layer, and a tetraethyl orthosilicate (TEOS) layer formed on the nitride layer.

5. The method of claim 1, wherein the barrier region comprises another doped region in the epitaxial layer at the bottom of the trench.

6. The method of claim 5, wherein the another doped region is of the first conductivity type.

7. The method of claim 5, wherein the another doped region is formed by performing an implantation process using an implant species of the first conductivity type before forming the doped region.

8. The method of claim 1, wherein the dielectric material comprises of an oxide, a nitride, undoped polysilicon or combinations thereof.

9. A semiconductor device, comprising:
    a substrate of a first conductivity type;
    an epitaxial layer of the first conductivity type grown on the substrate, wherein the epitaxial layer comprises at least one trench;
    a barrier region formed at a bottom of the trench, wherein the trench has an aspect ratio in a range of 1/12 to 1/8;
    a doped region of a second conductivity type formed in the epitaxial layer and surrounding sidewalls of the trench by an angled implantation process, wherein an implantation angle of the implantation process is about 2-5 degrees, such that the doped region surrounds a sidewall of the barrier region from a top to a bottom of the sidewall of the barrier region, wherein the barrier region prevents a dopant used for forming the doped region from reaching the epitaxial layer under the barrier region;
    a dielectric material disposed in the trench; and
    a pair of polysilicon gates disposed on the epitaxial layer and on both sides of the trench.

10. The semiconductor device of claim 9, wherein the barrier region comprises an insulating layer.

11. The semiconductor device of claim 10, wherein the insulating layer comprises a photoresist material.

12. The semiconductor device of claim 10, wherein the insulating layer is a multilayered structure comprising an oxide layer, a nitride layer formed on the oxide layer, and a tetraethyl orthosilicate (TEOS) layer formed on the nitride layer.

13. The semiconductor device of claim 9, wherein the barrier region comprises another doped region in the epitaxial layer at the bottom of the trench.

14. The semiconductor device of claim 13, wherein the another doped region is of the first conductivity type.

15. The semiconductor device of claim 9, wherein the dielectric material comprises an oxide, a nitride, undoped polysilicon or combinations thereof.

* * * * *